(12) United States Patent
Moughabghab

(10) Patent No.: US 6,191,655 B1
(45) Date of Patent: Feb. 20, 2001

(54) SIX INVERTING AMPLIFIER TRANSCONDUCTANCE STAGE AND METHODS FOR ITS USE

(75) Inventor: Raed Moughabghab, Mougins (FR)

(73) Assignee: Conexant Systems, Inc., Newport Beach, CA (US)

( * ) Notice: Under 35 U.S.C. 154(b), the term of this patent shall be extended for 0 days.

(21) Appl. No.: 09/385,225

(22) Filed: Aug. 27, 1999

(51) Int. Cl.[7] ........................................................ H03F 3/16
(52) U.S. Cl. ............................................ 330/277; 330/258
(58) Field of Search ............................... 330/258, 259, 330/277, 302, 303, 296; 327/199, 200, 218

(56) References Cited

U.S. PATENT DOCUMENTS

| | | |
|---|---|---|
| 3,991,380 | 11/1976 | Pryor . |
| 4,719,431 * | 1/1988 | Karsten ................................ 330/273 |
| 5,117,205 | 5/1992 | Nauta . |
| 5,332,937 | 7/1994 | Castello et al. . |
| 5,420,537 * | 5/1995 | Weedon et al. ...................... 330/251 |
| 5,444,414 | 8/1995 | Delano . |
| 5,510,751 | 4/1996 | Nauta . |
| 5,621,358 | 4/1997 | Pisati et al. . |
| 5,808,515 * | 9/1998 | Tsuruoka et al. .................... 330/277 |
| 5,828,265 | 10/1998 | Mensink et al. . |
| 5,880,641 | 3/1999 | Kim . |
| 5,986,509 * | 11/1999 | Lohninger ............................ 330/290 |
| 6,046,638 * | 4/2000 | Hogeboom ........................... 330/252 |

OTHER PUBLICATIONS

"A Design Technique for Controllable/Observable Continous–time Analog Active Filters", by Mani Soma, University of Washington, Apr. 28, 1999.

"A CMOS Transconductance–C Filter Technique for Very High Frequencies", by Bram Nauta, IEEE Journal of Solid–State Circuits, vol. 27, No. 2, Feb. 1992.

\* cited by examiner

*Primary Examiner*—Robert Pascal
*Assistant Examiner*—Henry Choe
(74) *Attorney, Agent, or Firm*—Snell & Wilmer

(57) ABSTRACT

Methods and apparatus to tune a transconductance stage include a current source and a six inverting amplifier stage. The current source establishes the biasing points of first and second inverting amplifiers, which in turn, provide a signal to a common mode feedback loop. By establishing the biasing points of the first and second inverting amplifiers, the transconductance of these inverting amplifiers may be controlled. Control of the transconductance permits control of the cut-off frequency of the transconductance stage. Furthermore, the ability to control the transconductance allows for control of the DC gain. In addition, establishing the biasing points of third and fourth inverting amplifiers by a second current source further controls the transconductance of these inverting amplifiers. Thus, further control of the transconductance permits further control of the cut-off frequency and DC gain of the transconductance stage. Therefore, tunability of the transconductance stage is provided.

20 Claims, 6 Drawing Sheets

US 6,191,655 B1

SIX INVERTING AMPLIFIER TRANSCONDUCTANCE STAGE AND METHODS FOR ITS USE

BACKGROUND OF THE INVENTION

1. Technical Field

This invention relates to a transconductance stage and methods for its use, and more specifically to a highly linear tunable six inverting amplifier transconductance stage and methods for its use.

2. Background Art and Technical Problems

In modem electronic circuits, there is a need for filter blocks which are highly linear, low power, and capable of high frequency. Filter blocks are especially advantageous and are used extensively in conjunction with the implementation of transceivers in the telecommunication and network fields. Analog transceiver chains contained in such transceivers generally contain several filtering blocks that allow the removal of parasitic signals so that a "clean" signal is delivered to the digital signal processing circuit. These filtering blocks are often distributed throughout the transceiver system and encompass filters extending in frequency range from very high frequency to very low frequency. By way of illustration, FIG. 1 shows an analog receiver chain 7 including a low noise amplifier (LNA) 25, a first filter 26, a mixer 27, a variable gain amplifier (VGA) 28, and a second filter 29.

Such filters can be implemented by using transconductance stages. Solutions to the issues of linearity and frequency control in high frequency filters have been disclosed in Nauta, "A CMOS Transconductance-C Filter Technique for Very High Frequencies," IEEE Journal Solid-State Circuits, Vol. 27, No. 2, February 1992, the disclosure of which is hereby incorporated by reference. The six inverting amplifier structure disclosed in Nauta contains no internal capacitive nodes, so that the circuit is suitable for high frequency applications. In addition, the disclosed structure contains only two transistors in series. The structure is therefore suitable for low voltage applications. Unfortunately, in the structure disclosed in Nauta, the only way that the cut-off frequency and DC gain can be controlled is by adjusting the power supply for the circuit. Adjusting the power supply of an integrated circuit is not a reasonable or practical method of operation, since integrated circuits in most applications operate from a fixed supply voltage. In addition, the Nauta circuit has very poor immunity to power supply noise because the devices are connected directly to the power supply. Because the circuit is controlled by changes in power supply, any noise in the power supply is reflected as a change in the output performance.

A need therefore exists for an improved transconductance stage which can be used for high frequency applications, in which the cut-off frequency can be controlled, which is highly linear, which has low power consumption, and for which the DC gain can be controlled.

SUMMARY OF THE INVENTION

In accordance with one embodiment of the present invention, an improved transconductance stage is provided that includes first and second parallel inverting amplifiers, the input terminals of which are AC coupled and provide a differential input to the transconductance stage. The outputs of the inverting amplifiers provide outputs for the transconductance stage. A common mode feedback loop is coupled across the outputs of the first and second inverting amplifiers. A current source establishes the biasing points of the first and second inverting amplifiers. The biasing points control the transconductance and hence the cut-off frequency of the transconductance stage. In turn, the biasing points can be varied by a control voltage coupled to the current source. Therefore, tunability of the transconductance stage is provided.

BRIEF DESCRIPTION OF THE DRAWING FIGURES

The subject invention will hereinafter be described in the context of the appended drawing figures, wherein like numerals denote like elements, and:

DETAILED DESCRIPTION OF PREFERRED EXEMPLARY EMBODIMENTS

Figure 1:
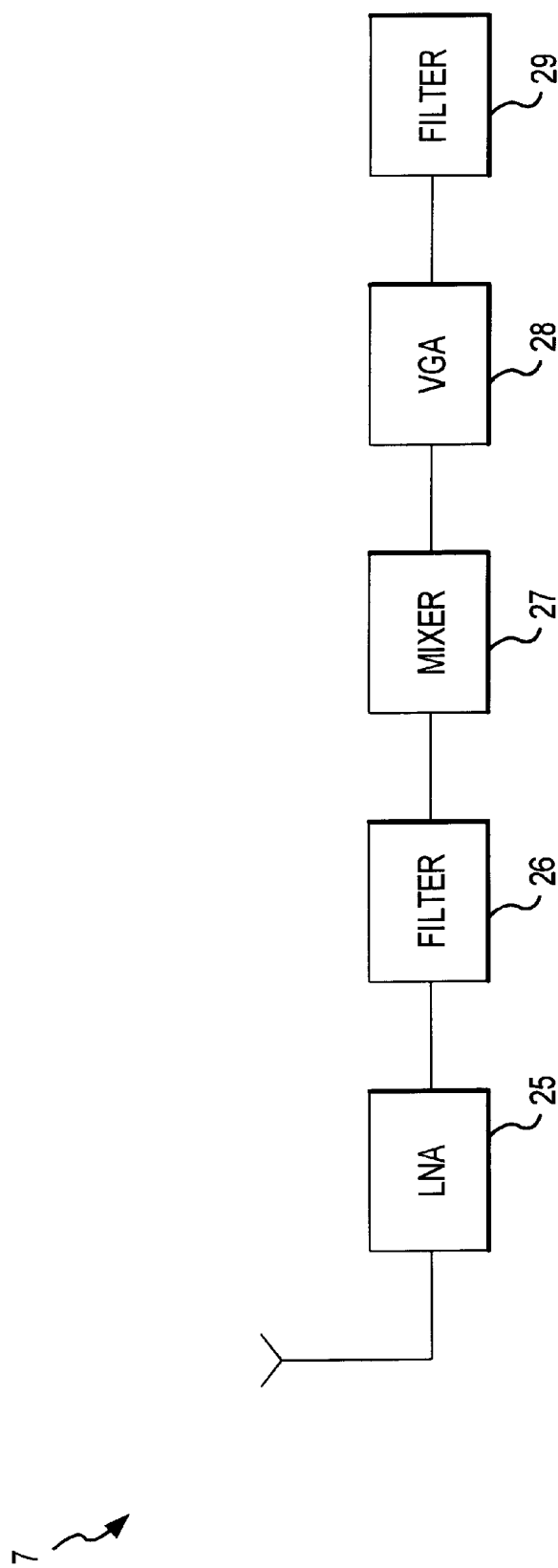
FIG. 1 is a schematic diagram illustrating an analog receiver chain.
Figure 2:
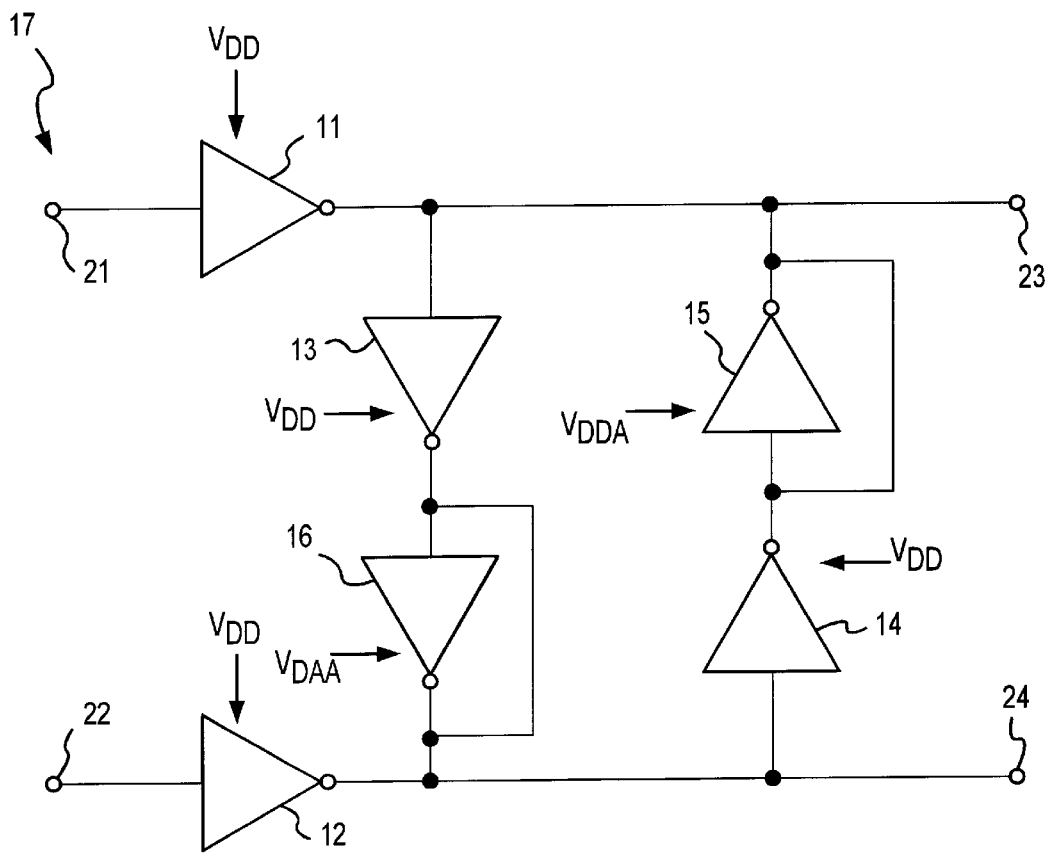
FIG. 2 is a schematic diagram illustrating a prior art transconductance stage using two power supplies to control the cut-off frequency and the dc gain.

FIG. 2 illustrates a six inverting amplifier transconductance stage 17 as found in the prior art. Transconductance stage 17 includes first and second parallel inverting amplifiers 11 and 12, respectively. Differential input to the transconductance stage is provided at inputs 21 and 22 of the parallel inverting amplifiers 11 and 12, respectively. Differential outputs of the transconductance stage are taken at output terminals 23 and 24 at the outputs of the two parallel inverting amplifiers 11 and 12, respectively. A common mode feedback loop is coupled across the output of the transconductance stage. The common mode feedback loop includes inverting amplifier 13 in series with inverting amplifier 16 for which the output of inverting amplifier 16 is tied back to the input of inverting amplifier 16. The input of inverting amplifier 13 is coupled to the output of the first parallel inverting amplifier 11. The output of inverting amplifier 16 is coupled to the output of the second parallel inverting amplifier 12. The common mode feedback loop also includes inverting amplifier 14 which has its input coupled to the output of inverting amplifier 12. In series with inverting amplifier 14 is a sixth inverting amplifier 15 which also has its output looped back to its input. The output of inverting amplifier 15 is coupled to the output of inverting amplifier 11.

The configuration of transconductance stage 17 fixes the common mode voltage at the outputs 23 and 24. The output common mode equivalent resistance is given by $1/(GM2+GM3)$, where GM2 is the transconductance of each of inverting amplifiers 15 and 16, GM3 is the transconductance of each of inverting amplifiers 13 and 14, and/denotes division. The output differential mode equivalent resistance is given by $1/(GM2-GM3)$. By selecting the values of GM2 and GM3, the impedance for common mode can be made low and the impedance for differential mode can be made high. Thus, control of the transconductance values GM2 and GM3 results in control of the output common mode resistance and output differential mode resistance.

Transconductance stage 17, however, is impractical for integrated applications because control of the stage, including control of the cut-off frequency and the DC gain, requires two separate power supplies. In addition, each power supply must be variable which is impractical in an integrated environment. For example, the biasing points of inverting amplifiers 11, 12, 13, and 14 are set by VDD, but the biasing points of inverting amplifiers 15 and 16 require a separate power supply VDDA. VDD controls inverting amplifiers 11, 12, 13, and 14 by varying the gate to source voltage, VGS, of the transistors in each of inverting amplifiers 11, 12, 13, and 14. In turn, this controls their respective transconductances such that control of the transconductance at the outputs 23 and 24 is provided.

In a similar manner, VDDA controls inverting amplifiers 15 and 16 by controlling the gate to source voltage, VGS, of the transistors in each of inverting amplifiers 15 and 16, and hence their respective transconductances. Thus, by controlling the transconductance of each of inverting amplifiers 13 and 14 (GM3) and each of inverting amplifiers 15 and 16 (GM2), the output differential mode resistance (1/(GM2−GM3)) and the output common mode resistance (1/(GM2+GM3)) can both be controlled. Accordingly, VDD controls the transconductance and VDDA controls the output resistance at the outputs 23 and 24 of transconductance stage 17. As explained below, control of the transconductance translates into control of the cut-off frequency.

However, although some control of the cut-off frequency is provided, the use of variable power supplies is not practical for such reasons as: 1) power supplies are usually fixed, 2) the ability to vary the power increases the total power used by the transconductance stage, and 3) power supplies used to vary circuit parameters create noise. Thus, although the six inverting amplifier transconductance stage 17 has many potential advantages, to find practical application there is a need for another way of controlling the tunability of such transconductance stages.

Figure 3:
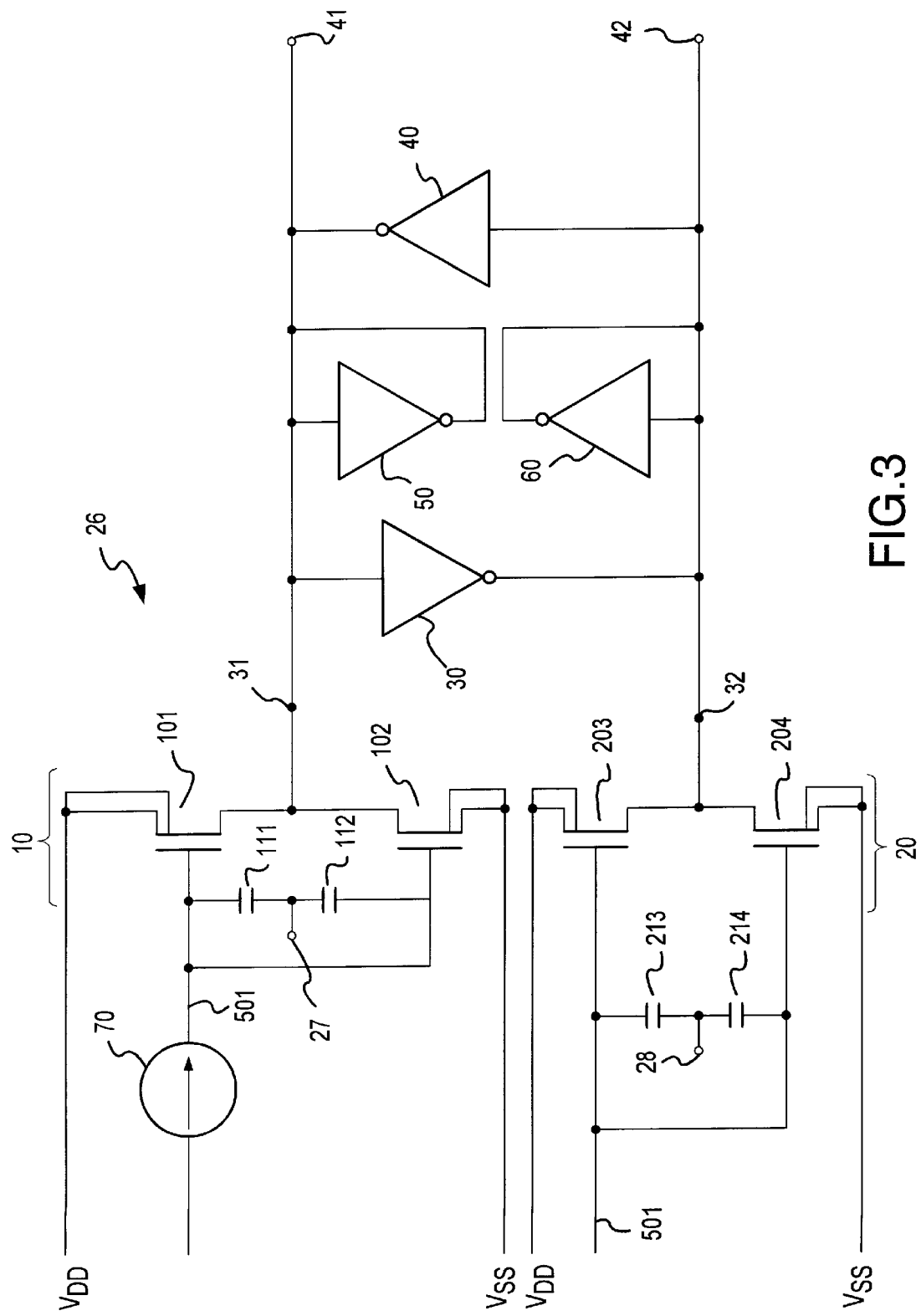
FIG. 3 is a schematic diagram illustrating one embodiment of a transconductance stage of the present invention having improved cut-off frequency control.

The deficiencies of the prior art structure are overcome by a transconductance stage 26 as illustrated in FIG. 3. In accordance with this embodiment of the present invention, transconductance stage 26 requires only the commonly available fixed power supplies such as VDD and VSS or VDD and ground. The transconductance stage 26 of this embodiment uses a current source 70 to vary the biasing points of the first and second inverting amplifiers 10 and 20. Current source 70 can be any commonly available current source. Transconductance stage 26 includes a current source 70, first inverting amplifier 10, second inverting amplifier 20 in parallel with first inverting amplifier 10, and a common mode feedback loop including third, fourth, fifth, and sixth inverting amplifiers 30, 40, 50, and 60, respectively.

In a preferred embodiment, each of the six inverting amplifiers is a CMOS inverting amplifier including a p-channel MOS transistor in series with an n-channel MOS transistor. For example, first inverting amplifier 10 includes p-channel MOS transistor 101 in series with n-channel MOS transistor 102. Current source 70 is coupled to the gates of transistors 101 and 102, and provides the DC biasing point of first inverting amplifier 10. Capacitors 111 and 112 are coupled to the input 27 of first inverting amplifier 10. The source and substrate of transistor 101 are coupled to a power supply VDD. The drain of transistor 101 is coupled to the drain of transistor 102 which forms the output 31 of first inverting amplifier 10. The source and substrate of transistor 102 are coupled to a power supply VSS.

Current source 70 is also coupled to the gates of transistor 203 and transistor 204 of second inverting amplifier 20. Capacitors 213 and 214 are coupled to the input 28 of second inverting amplifier 20. The source and substrate of transistor 203 are coupled to VDD, and the source and substrate of transistor 204 are coupled to VSS. The drain of transistor 203 is coupled to the drain of transistor 204 which forms the output 32 of second inverting amplifier 20. Output 31 is coupled to the input of third inverting amplifier 30 and to the input and output of fifth inverting amplifier 50. Output 32 is coupled to the output of third inverting amplifier 30, and the input and output of sixth inverting amplifier 60. The input of fourth inverting amplifier 40 is coupled to the output 32, and the output of fourth inverting amplifier 40 is coupled to the output 31. Transconductance stage 26 has outputs 41 and 42.

With continued reference to FIG. 3, current source 70 controls the biasing points of transistors 101, 102, 203, and 204 through node 501. By controlling the biasing points of first inverting amplifier 10 and second inverting amplifier 20, current source 70 also controls the transconductance of these devices. The cut-off frequency of transconductance stage 26 is directly proportional to the transconductance of transconductance stage 26. The cut-off frequency of transconductance stage 26 is equal to GMD/(2*π* C1), where GMD is the differential transconductance at the output of transconductance stage 26, C1 is the load capacitance at outputs 41 and 42, and * denotes multiplication. Thus, control of the output differential transconductance GMD permits control of the cut-off frequency, so that tuning of transconductance stage 26 is provided.

The ability to control the inductance of transconductance stage 26 further allows control of the DC gain for differential mode signals. The DC gain for differential mode signals is given by ADC=GMD/(GO1+GM2−GM3), where GO1 is the output conductance of each of inverting amplifiers 10 and 20, GM2 is the transconductance of each of inverting amplifiers 50 and 60, and GM3 is the transconductance of each of inverting amplifiers 30 and 40. GO1 is proportional to the current through each of inverting amplifiers 10 and 20. Thus, if (GO1+GM2) can be made equal to GM3, then the denominator of the DC gain ADC equals zero so that the DC gain ADC becomes infinite. The denominator (GO1+GM2−GM3) represents the output impedance of transconductance stage 26. Partically, when (GO1+GM2)=GM3, then the losses are canceled out, or zeroed. Therefore, the impedance of transconductance stage 26 approaches zero, and thus the DC gain ADC approaches infinity.

In accordance with a preferred embodiment of the invention, AC coupling the inputs 27 and 28 of first inverting amplifier 10 and second inverting amplifier 20, respectively, further controls the gates of transistors 101, 102, 203, and 204. For example, changes in the DC voltages at inputs 27.and 28 will not affect the biasing points of the gates of these devices because the AC coupling removes the DC bias. Thus, further control of the biasing points of transistors 101, 102, 203, and 204 provides further control of the transconductances of first and second inverting amplifiers 10 and 20. Therefore, improved DC gain control and cut-off frequency control are provided.

Applying a differential voltage across inputs 27 and 28 of first inverting amplifier 10 and second inverting amplifier 20, respectively, creates an output differential current of transconductance stage 26 at the outputs 41 and 42 given by IOD=GMD*VID. IOD is the output differential current of transconductance stage 26, GMD is the differential transconductance at the output of transconductance stage 26, and VID is the input differential voltage of transconductance stage 26. Accordingly, the output differential current and the input differential voltage are linearly related.

Figure 4:
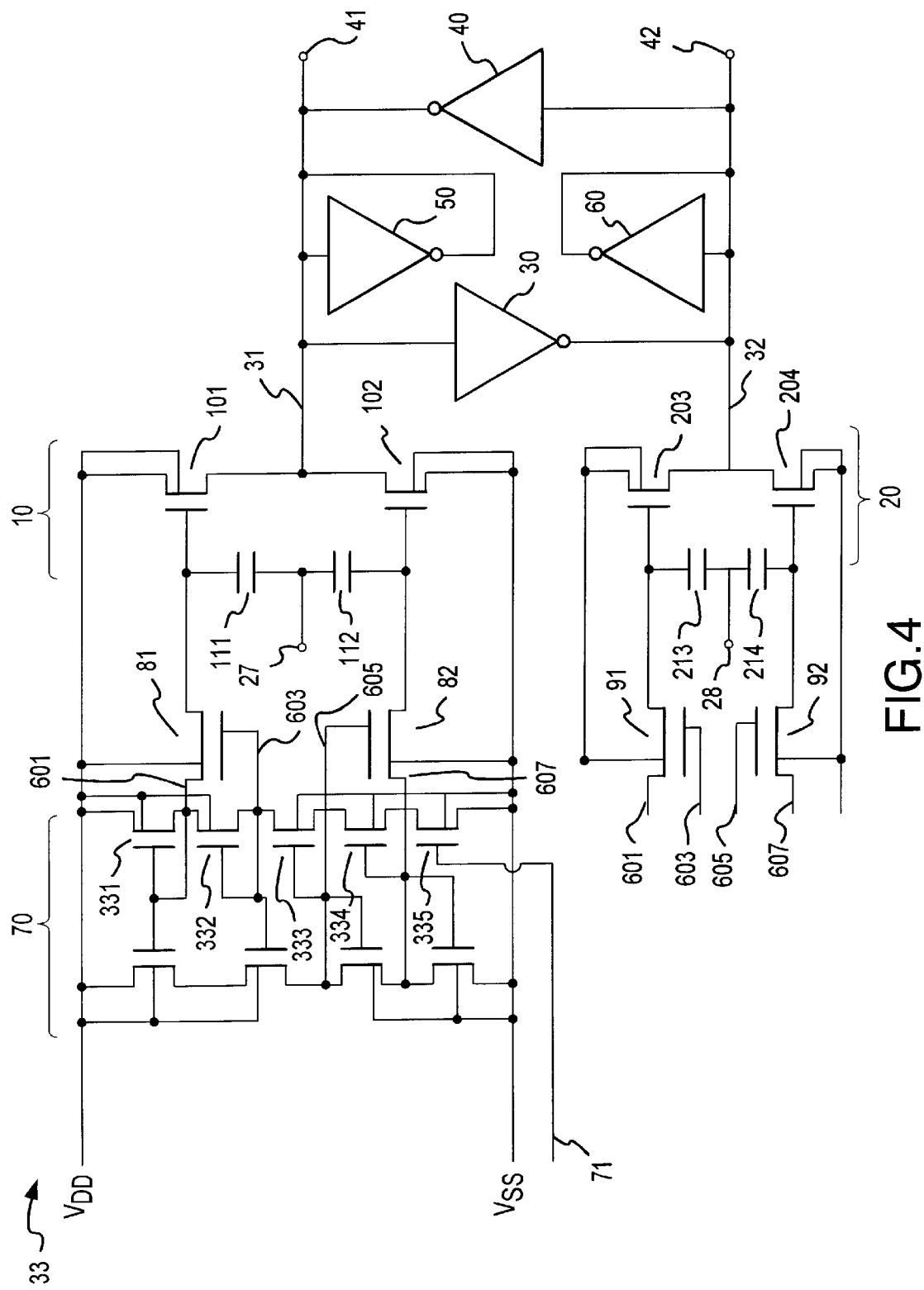
FIG. 4 is a schematic diagram illustrating another embodiment of the transconductance stage of the present invention having improved cut-off frequency control.

Referring now to FIG. 4, another embodiment of the present invention is illustrated by transconductance stage 33. Transconductance stage 33 is similar to transconductance stage 26, but further includes resistive elements 81, 82, 91, and 92.

FIG. 4 also illustrates one embodiment of current source 70. Current source 70 biases the gate of transistor 101 through resistive element 81 and the gate of transistor 102 through resistive element 82. In a preferred embodiment, resistive elements 81 and 82 can be MOS devices biased in the triode region. The resistance of resistive elements 81 and 82 will be determined by the bias applied to them by current source 70. The resistive elements 81 and 82 could also be polycrystalline silicon resistors, or the like. Those skilled in the art will appreciate that any of the commonly used resistive devices for integrated circuits may be used. In a similar manner, current source 70 biases the gate of transistor 203 through resisve element 91 and the gate of transistor 204 through resistive element 92. Thus, control of the voltage applied to the gates of transistors 101, 102, 203, and 204 provides control of the transconductances of first and second inverting amplifiers 10 and 20.

With continued reference to FIG. 4, a control voltage 71 controls the gate of MOS device 335, causing MOS device 335 to act as a variable resistor. The current flowing through the serially connected transistors 331, 332, 333, 334, and 335 is controlled by the value of the variable resistance provided by MOS device 335. The serially connected transistors 331, 332, 333, 334, and 335 behave as a voltage controlled current source (VCCS). Furthermore, a phase lock loop (PLL) can be used to automatically control the control voltage 71. By varying the current in current source 70, the voltage at nodes 601, 603, 605, and 607 are controlled. The voltages at these nodes are applied to transconductance stage 33 to set the bias points of first and second inverting amplifiers 10 and 20. Accordingly, control voltage 71 controls the transconductance of each of inverting amplifiers 10 and 20. In this way, the transconductance of transconductance stage 33 can be controlled. Thus, as explained above, control of the transconductance provides control of the cut-off frequency of transconductance stage 33. Therefore, a new way of controlling the tunability of transconductance stage 33 is presented.

Figure 5:
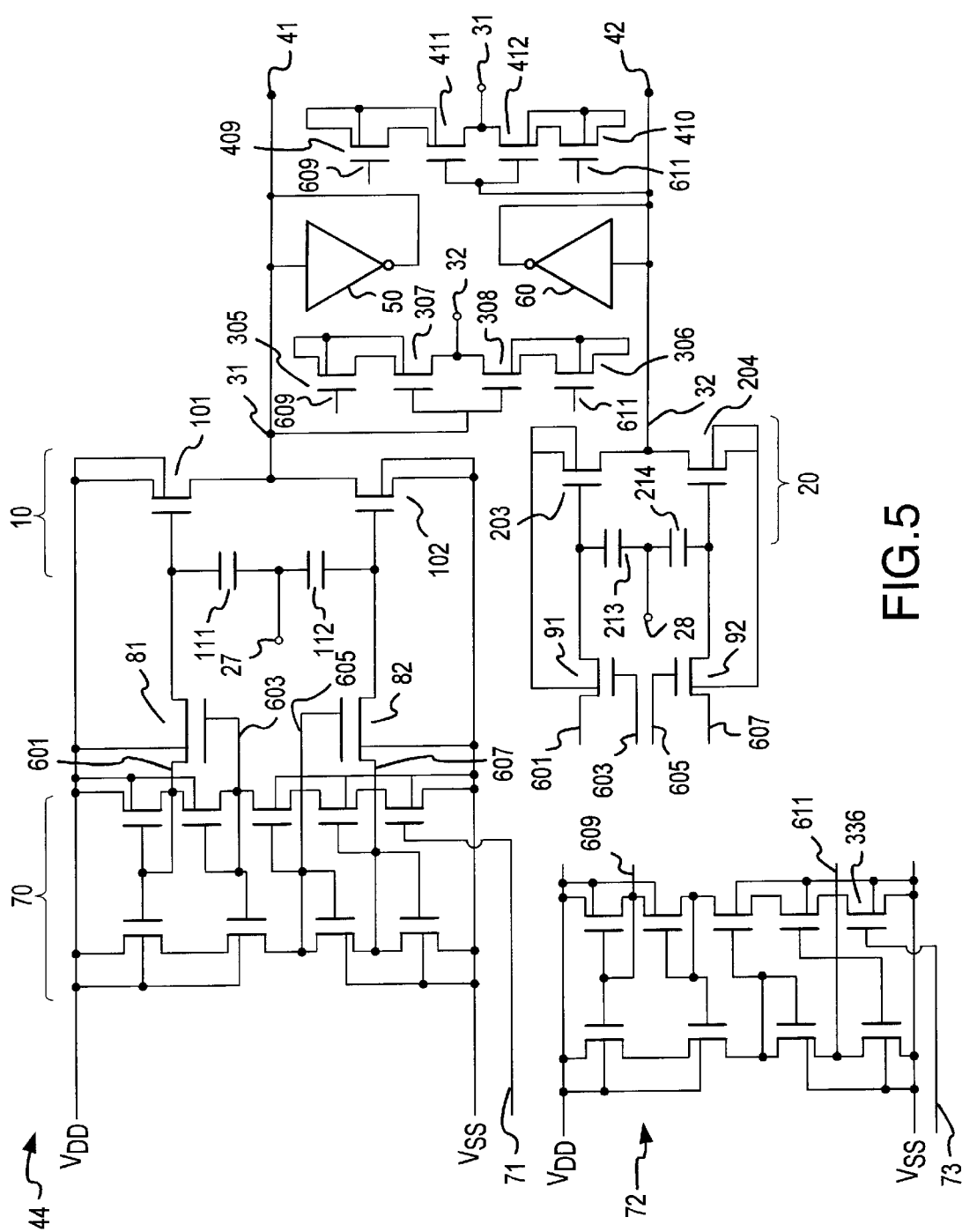
FIG. 5 is a schematic diagram illustrating yet another embodiment of the transconductance stage of the present invention having improved DC gain control.

Referring now to FIG. 5, yet another embodiment of the present invention is illustrated by transconductance stage 44. Transconductance stage 44 is similar to transconductance stage 26 of FIG. 2 and transconductance stage 33 of FIG. 3; however, it further includes a second current source 72 with a second control voltage 73, a modified third inverting amplifier 30, and a modified fourth inverting amplifier 40. Once again, the inverting amplifiers are preferably CMOS inverting amplifiers. However, one skilled in the art will appreciate that any technology commonly used in integrated circuits may be used.

By way of illustrative example, inverting amplifier 30 has a p-channel MOS transistor 307 in series with an n-channel MOS transistor 308. In accordance with this embodiment of the present invention, an additional p-channel transistor 305 is coupled in series with transistor 307 and an additional n-channel transistor 306 is coupled in series with transistor 308. The source and substrate of transistor 305 are coupled to a power supply and the drain of transistor 305 is coupled to the source of transistor 307. The source and substrate of transistor 306 are coupled to a power supply and the drain of transistor 306 is coupled to the source of transistor 308. The drains of transistor 307 and transistor 308 are coupled to each other and to output 32, and the gates of transistor 307 and transistor 308 are coupled to output 31.

In a similar manner, fourth inverting amplifier 40 has a p-channel MOS transistor 411 in series with an n-channel MOS transistor 412. Further, an additional p-channel transistor 409 is coupled in series with transistor 411 and an additional n-channel transistor 410 is coupled in series with transistor 412. The source and substrate of transistor 409 are coupled to a power supply and the drain of transistor 409 is coupled to the source of transistor 411. The source and substrate of transistor 410 are coupled to a power supply and the drain of transistor 410 is coupled to the source of transistor 412. The drains of transistor 411 and transistor 412 are coupled to each other and to output 31. The gates of transistor 411 and transistor 412 are coupled to output 32.

Second current source 72 behaves much in the same way as does current source 70 of FIG. 2 and FIG. 3 in that second control voltage 73 controls the gate of a MOS device 336 so that MOS device 336 acts as a variable resistor. Those skilled in the art will appreciate that any device capable of behaving as a variable resistor may be used, such as those commonly used in integrated circuits. In addition, a phase lock loop (PLL) can be used to automatically control the second control voltage 73. By setting second control voltage 73, the resistance of MOS device 336 is set Setting the resistance controls the voltages at nodes 609 and 611.

Second current source 72 biases the gates of transistors 305, 306, 409, and 410. The voltages at nodes 609 and 611 of second current source 72 bias the gates of transistors 305 and 306, respectively. In addition, the voltages at nodes 609 and 611 bias the gates of transistors 409 and 410, respectively. By biasing the gates of transistors 305, 306, 409, and 410, second control voltage 73 can vary the current in third and fourth inverting amplifiers 30 and 40 in order to further control their respective transconductances. Thus, further control of the transconductances of third and fourth inverting amplifiers 30 and 40 better controls the losses of the transconductance stage 44. Therefore, improved DC gain control of transconductance stage 44 is provided.

Overall, setting the biasing points of inverting amplifiers 10, 20, 30, 40, 50, and 60 through the various transistors 101, 102, 203, 204, 305, 306, 409, and 410 determines the transconductance and furthermore the DC gain of transconductance stage 44.

Figure 6:
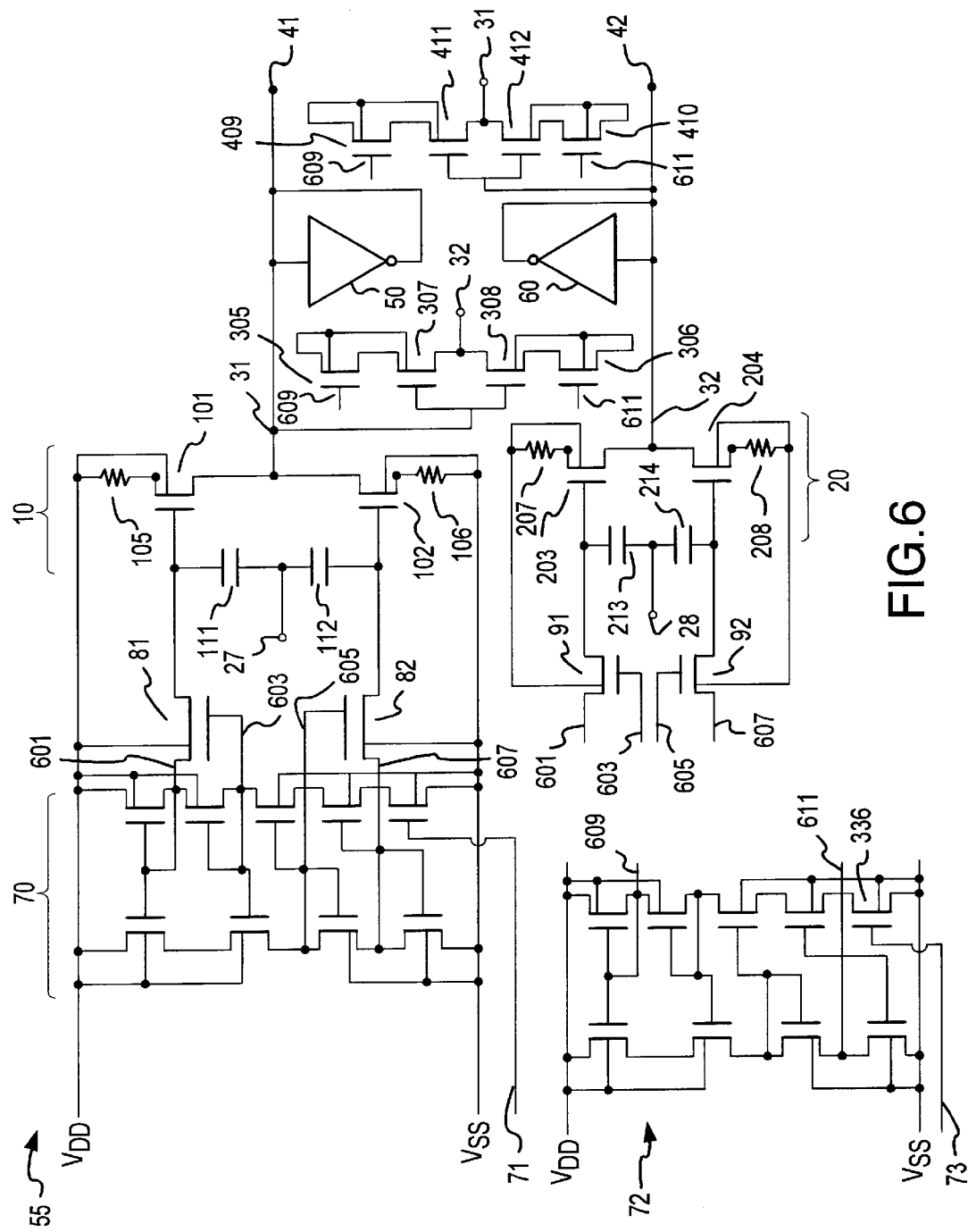
FIG. 6 is a schematic diagram illustrating a further embodiment of the transconductance stage of the present invention having improved linearity and distortion.

Referring now to FIG. 6, yet another embodiment of the present invention is illustrated by transconductance stage 55. Transconductance stage 55 is similar to transconductance stages 26 of FIG. 2, 33 of FIG. 3, and 44 of FIG. 4; however, it further includes a resistive element 105 coupled to VDD and transistor 101, a resistive element 106 coupled to VSS and transistor 102, a resistive element 207 coupled to VDD and transistor 203, and a resistive element 208 coupled to VSS and transistor 204. In a preferred embodiment, resistive elements 105, 106, 207, and 208 are linear resistors that can be implemented, for example, as polycrystalline silicon resistors, thin film resistors, or the like. Those skilled in the art will appreciate that any other technology commonly used in the fabrication of integrated circuits to produce linear resistors, or the like, may be used.

The modifications made to transconductance stage 55 can be implemented with transconductance stage 26 of FIG. 2, transconductance stage 33 of FIG. 3, or transconductance stage 44 of FIG. 4. Adding resistive elements in series with the active devices of first inverting amplifier 10 and second inverting amplifier 20 improves linearity. The resistance of the combination of a transistor in series with a linear resistor is Rtot=(1+GMT*R)/GMT, where GMT is the transconductance of each of transistors 101, 102, 203, and 204 and R is the linear resistance of each of resistive elements 105, 106, 207, and 208. The transconductance of a transistor GMT is not linear, but can be tuned. Accordingly, a MOS transistor operating in its linear region provides an on-resistance that is tunable. However, even in its linear region, the on-resistance is not linear. Thus, the MOS transistor is a variable but non-linear device. Non-linear devices cause distortion.

The linear resistor R cannot be tuned. Adding linear devices, such as linear resistor R, in combination with variable but non-linear devices improves overall distortion because voltage is distributed across a non-linear device and a linear device. Accordingly, the distortion on average is decreased. By adding a linear resistor in series with the MOS transistor, the linearity of the transconductance stage 55 is improved at the expense of an attendant loss in tunability. Together, the two provide a compromise on linearity and tunability. Furthermore, the values of R and GMT implemented in a particular application must be determined based on the amount of linearity and tunability required for the application.

The following non-limiting examples show the simulated results achieved by the present invention, in accordance with the embodiment illustrated by FIG. 6. For a 1 V peak to peak differential input, a 3 V power supply, and a frequency of 50 MHz, the power consumption decreased from about 85 mW in an embodiment in accordance with the prior art to about 7 mW in the present invention. Other simulations showed the following results for a 1 V peak to peak differential input and a 10 V power supply:

- an input fundamental frequency of 1 MHz achieved an output fundamental amplitude of −6.2 dB, an output third harmonic amplitude of −65.1 dB, and an output fifth harmonic of −83.1 dB;
- an input fundamental frequency of 10 MHz achieved an output fundamental amplitude of −6.2 dB, an output third harmonic amplitude of −62.5 dB, and an output fifth harmonic of −75 dB;
- an input fundamental frequency of 20 MHz achieved an output fundamental amplitude of −6.2 dB, an output third harmonic amplitude of −56.5 dB, and an output fifth harmonic of −70 dB;
- an input fundamental frequency of 30 MHz achieved an output fundamental amplitude of −6.2 dB, an output third harmonic amplitude of −53.5 dB, and an output fifth harmonic of −67.3 dB;
- an input fundamental frequency of 80 MHz achieved an output fundamental amplitude of −6.5 dB, an output third harmonic amplitude of −47.2 dB, and an output fifth harmonic of −62.6 dB; and
- an input fundamental frequency of 100 MHz achieved an output fundamental amplitude of −6.6 dB, an output third harmonic amplitude of −46.5 dB, and an output fifth harmonic of −62.5 dB.

Overall, the invention allows for better tunability of a transconductance stage in order to control the cut-off frequency and DC gain, provide a highly linear transconductance stage, and consume a low amount of power.

Although the invention has been described herein with reference to the appended drawing figures, it will be appreciated that the scope of the invention is not so limited. Various modifications in the design and implementation of various components and method steps discussed herein may be made without departing from the spirit and scope of the invention, as set forth in the appended claims.

What is claimed is:

1. A transconductance stage, comprising:
    first and second parallel inverting amplifiers each having an input and an output, wherein the inputs of said first and second parallel inverting amplifiers are AC coupled to provide an input to the transconductance stage;
    a first current source coupled to the inputs of said first and second parallel inverting amplifiers;
    output terminals of the transconductance stage coupled to outputs of said first and second parallel inverting amplifiers;
    third and fourth series inverting amplifiers coupled across said output of the transconductance stage; and
    fifth and sixth series inverting amplifiers coupled across said output of the transconductance stage.

2. The apparatus of claim 1, further comprising a first control voltage capable of varying the biasing points of said first current source and whereby said first control voltage is automatically controlled by a phase lock loop.

3. The transconductance stage of claim 1, wherein said first inverting amplifier comprises, in series, a first linear resistor, a p-channel transistor, an n-channel transistor, and a second linear resistor.

4. The apparatus of claim 1, further comprising a first resistive element and a second resistive element coupled between said first current source and said first inverting amplifier, and a third resistive element and a fourth resistive element coupled between said first current source and said second inverting amplifier.

5. The transconductance stage of claim 1, wherein said third inverting amplifier comprises, in series, first and second n-channel transistors and first and second p-channel transistors, and wherein said output of said first inverting amplifier is coupled to the commonly coupled gates of said first n-channel transistor and said first p-channel transistor, and further comprising a second current source providing two output levels coupled to said second n-channel transistor and said second p-channel transistor, respectively.

6. The transconductance stage of claim 1, wherein said first inverting amplifier comprises, in series, an n-channel transistor and a p-channel transistor and said first current source provides two output levels, the first output level coupled to said n-channel transistor and the second output level coupled to said p-channel transistor.

7. The transconductance stage of claim 6, wherein said first output level is coupled to said n-channel transistor through a second n-channel transistor and said second output level is coupled to said p-channel transistor through a second p-channel transistor.

8. The apparatus of claim 1, further comprising:
    a first resistive element and a second resistive element coupled between said first current source and said first inverting amplifier, a third resistive element and a fourth resistive element coupled between said first current source and said second inverting amplifier;
    said first inverting amplifier includes, in series, a first transistor and a second transistor;
    said second inverting amplifier includes, in series, a third transistor and a fourth transistor;

a second current source having first and second biasing points coupled to said third and fourth inverting amplifiers to provide first and second voltages;

said third inverting amplifier includes an input and an output, a fifth transistor, a sixth transistor, a seventh transistor, and an eighth transistor, in series, and wherein said fourth inverting amplifier includes an input and an output, a ninth transistor, a tenth transistor, an eleventh transistor, and a twelfth transistor, in series, and wherein:

the input of said third inverting amplifier is coupled to first and second transistors of said first inverting amplifier and the output of said third inverting amplifier is coupled to third and fourth transistors of said second inverting amplifier; and the output of said fourth inverting amplifier is coupled to said first and second transistors and the input of said fourth inverting amplifier is coupled to said third and fourth transistors; and wherein the input and output of said fifth inverting amplifier are coupled to said first and second transistors, and wherein the input and output of said sixth inverting amplifier are coupled to said third and fourth transistors.

9. The apparatus of claim 8 wherein:

the gate of said fifth transistor is coupled to a first biasing point of said second current source and the gate of said sixth transistor is coupled to a second biasing point of said second current source;

the drain of said fifth transistor is coupled to the source of said seventh transistor;

the drain of said sixth transistor is coupled to the source of said eighth transistor;

the gates of said seventh and eighth transistors are coupled to the drains of said first and second transistors and the drains of said seventh and eighth transistors are coupled to the drains of said third and fourth transistors;

the gate of said ninth transistor is coupled to said first biasing point of said second current source and the gate of said tenth transistor is coupled to said second biasing point of said second current source;

the drain of said ninth transistor is coupled to the source of said eleventh transistor;

the drain of said tenth transistor is coupled to the source of said twelfth transistor; and the gates of said eleventh and twelfth transistors are coupled to the drains of said third and fourth transistors and the drains of said eleventh and twelfth transistors are coupled to the drains of said first and second transistors.

10. The apparatus of claim 9, further comprising a second control voltage associated with said second current source capable of varying the voltage of said second current source.

11. The apparatus of claim 1, further comprising a first control voltage capable of varying the biasing points of said first current source and whereby said first control voltage is automatically controlled by a phase lock loop;

a first resistive element and a second resistive element coupled between said first current source and said first inverting amplifier, and a third resistive element and a fourth resistive element coupled between said first current source and said second inverting amplifier;

wherein said third inverting amplifier comprises, in series, first and second n-channel transistors and first and second p-channel transistors, and wherein said output of said first inverting amplifier is coupled to the commonly coupled gates of said first n-channel transistor and said first p-channel transistor;

a second current source providing two output levels coupled to said second n-channel transistor and said second p-channel transistor, respectively; and a second control voltage associated with said second current source capable of varying the voltage of said second current source.

12. A method for filtering a signal, comprising the steps of:

a) inputting the signal to first and second inverting amplifiers of a transconductance stage, wherein the signal is AC coupled to said first and second inverting amplifiers;

b) biasing said first and second inverting amplifiers with a first current source;

c) coupling a first input of a common mode feedback loop to the output of said first inverting amplifier and coupling a second input of said common mode feedback loop to the output of said second inverting amplifier; and d) delivering an output signal from said common mode feedback loop.

13. The method of claim 12, wherein controlling the biasing points of said first current source further includes varying a first control voltage associated with said first current source whereby said first control voltage is automatically controlled by a phase lock loop.

14. The method of claim 12, further comprising the step of coupling a first resistive element between said first inverting amplifier and a first power supply, coupling a second resistive element between said first inverting amplifier and a second power supply, coupling a third resistive element between said second inverting amplifier and said first power supply, and coupling a fourth resistive element between said second inverting amplifier and said second power supply.

15. The method of claim 14, further comprising:

providing a second current source having first and second output levels;

providing said common mode feedback loop including a third inverting amplifier in series with a fifth inverting amplifier, and a fourth inverting amplifier in series with a sixth inverting amplifier;

coupling the input and output of said fifth inverting amplifier to said first inverting amplifier, and coupling the input and output of said sixth inverting amplifier to said second inverting amplifier;

setting the bias point of said third inverting amplifier by a first output level of said second current source; and setting the bias point of said fourth inverting amplifier by a second output level of said second current source.

16. The method of claim 15, wherein varying the biasing points of said second current source includes using a second control voltage.

17. The method of claim 12, further comprising controlling the biasing points of said first current source by varying a first control voltage associated with said first current source whereby said first control voltage is automatically controlled by a phase lock loop;

coupling a first resistive element between said first inverting amplifier and a first power supply;

coupling a second resistive element between said first inverting amplifier and a second power supply;

coupling a third resistive element between said second inverting amplifier and said first power supply;

coupling a fourth resistive element between said second inverting amplifier and said second power supply;

providing a second current source having first and second output levels;

providing said common mode feedback loop including a third inverting amplifier in series with a fifth inverting amplifier, and a fourth inverting amplifier in series with a sixth inverting amplifier;

coupling the input and output of said fifth inverting amplifier to said first inverting amplifier, and coupling the input and output of said sixth inverting amplifier to said second inverting amplifier;

setting the bias point of said third inverting amplifier by a first output level of said second current source;

setting the bias point of said fourth inverting amplifier by a second output level of said second current source; and varying the biasing points of said second current source by using a second control voltage.

18. A transceiver system, comprising:

an analog transceiver chain with filtering blocks;

said filtering blocks include at least one of a transconductance stage including:

first and second parallel inverting amplifiers, wherein the inputs of said first and second parallel inverting amplifiers are AC coupled to provide an input to the transconductance stage;

a first current source coupled to the inputs of said first and second parallel inverting amplifiers;

output terminals of the transconductance stage coupled to outputs of said first and second parallel inverting amplifiers;

third and fourth series inverting amplifiers coupled across said output of the transconductance stage; and fifth and sixth series inverting amplifiers coupled across said output of the transconductance stage.

19. The transceiver system of claim 18, further comprising a first control voltage capable of varying the biasing points of said first current source and whereby said first control voltage is automatically controlled by a phase lock loop;

a first resistive element and a second resistive element coupled between said first current source and said first inverting amplifier, and a third resistive element and a fourth resistive element coupled between said first current source and said second inverting amplifier;

wherein said third inverting amplifier comprises, in series, first and second n-channel transistors and first and second p-channel transistors, and wherein said output of said first inverting amplifier is coupled to the commonly coupled gates of said first n-channel transistor and said first p-channel transistor;

a second current source providing two output levels coupled to said second n-channel transistor and said second p-channel transistor, respectively; and a second control voltage associated with said second current source capable of varying the voltage of said second current source.

20. A transconductance stage, comprising:

first and second parallel inverting amplifiers each having an input and an output, wherein the inputs of said first and second parallel inverting amplifiers are AC coupled to provide an input to the transconductance stage;

a first current source coupled to the inputs of said first and second parallel inverting amplifiers;

output terminals of the transconductance stage coupled to outputs of said first and second parallel inverting amplifiers; and a first input of a common mode feedback loop coupled to the output of said first inverting amplifier and a second input of said common mode feedback loop coupled to the output of said second inverting amplifier.

* * * * *